US010674633B2

(12) United States Patent
Lee

(10) Patent No.: US 10,674,633 B2
(45) Date of Patent: Jun. 2, 2020

(54) PLUG ASSEMBLY

(71) Applicant: Nano Shield Technology Co., Ltd., Taipei (TW)

(72) Inventor: James Cheng Lee, La Habra, CA (US)

(73) Assignee: Nano Shield Technology Co., Ltd., Taipei (TW)

( * ) Notice: Subject to any disclaimer, the term of this patent is extended or adjusted under 35 U.S.C. 154(b) by 0 days.

(21) Appl. No.: 16/446,952

(22) Filed: Jun. 20, 2019

(65) Prior Publication Data

US 2019/0394897 A1 Dec. 26, 2019

Related U.S. Application Data

(60) Provisional application No. 62/688,393, filed on Jun. 22, 2018.

(30) Foreign Application Priority Data

Sep. 28, 2018 (TW) ............................ 107213210 U

(51) Int. Cl.
*H05K 7/20* (2006.01)
*H05K 1/11* (2006.01)
(Continued)

(52) U.S. Cl.
CPC ......... *H05K 7/20445* (2013.01); *H05K 1/111* (2013.01); *H05K 1/18* (2013.01); *H05K 5/006* (2013.01); *H05K 5/0052* (2013.01); *H05K 7/205* (2013.01); *H05K 7/20336* (2013.01); *H05K 7/20409* (2013.01); *H05K 2201/09063* (2013.01); *H05K 2201/09163* (2013.01)

(58) Field of Classification Search
CPC ........ H05K 1/111; H05K 1/18; H05K 5/0052; H05K 5/006; H05K 7/20336; H05K 7/20436; H05K 7/20445; H05K 7/20409; H05K 7/205; H05K 2201/09063; H05K 2201/09163
See application file for complete search history.

(56) References Cited

U.S. PATENT DOCUMENTS

2001/0028555 A1* 10/2001 Takeuchi ............... H05K 5/006 361/752
2005/0048850 A1* 3/2005 Zoller ................. B60R 16/0239 439/761

(Continued)

*Primary Examiner* — Jacob R Crum
(74) *Attorney, Agent, or Firm* — Idea Intellectual Limited; Margaret A. Burke; Sam T. Yip

(57) ABSTRACT

A plug assembly includes a lower cover, an upper cover mounted on the lower cover, and a circuit board. The upper cover is equipped with a heat-conducting element. The circuit board is mounted between the upper cover and the lower cover. The circuit board has two first contact portions contacting with the lower cover and the upper cover, and a plurality of second contact portions. The circuit board is equipped with a chip. The chip is mounted on and covers the plurality of the second contact portions. The chip contacts with the heat-conducting element. The circuit board opens at least one perforation. At least one of the lower cover and the upper cover protrudes towards the circuit board to form at least one fastening portion passing through the at least one perforation and contacting with the at least one of the upper cover and the lower cover.

20 Claims, 6 Drawing Sheets

(51) Int. Cl.
*H05K 5/00* (2006.01)
*H05K 1/18* (2006.01)

(56) References Cited

U.S. PATENT DOCUMENTS

| | | | | |
|---|---|---|---|---|
| 2009/0237887 | A1* | 9/2009 | Shibata | H05K 7/20445 361/709 |
| 2011/0304996 | A1* | 12/2011 | Wu | G02B 6/4261 361/752 |
| 2012/0208405 | A1* | 8/2012 | Wang | H01R 12/716 439/676 |
| 2014/0009891 | A1* | 1/2014 | Chen | H05K 7/2039 361/720 |
| 2014/0233197 | A1* | 8/2014 | Schwab | H05K 5/03 361/757 |
| 2014/0334104 | A1* | 11/2014 | Yang | H05K 5/0047 361/709 |
| 2015/0313035 | A1* | 10/2015 | Kroeckel | H05K 1/117 361/759 |
| 2016/0128208 | A1* | 5/2016 | Bolik | H05K 5/0013 361/709 |
| 2016/0259137 | A1* | 9/2016 | Akabane | G02B 6/4292 |

* cited by examiner

PLUG ASSEMBLY

CROSS-REFERENCE TO RELATED APPLICATION

This application claims the priorities of U.S. provisional patent application No. 62/688,393, filed on Jun. 22, 2018 and Taiwan patent application no. 107213210, filed on Sep. 28, 2018, which are incorporated herewith by reference.

BACKGROUND OF THE INVENTION

1. Field of the Invention

The present invention generally relates to a plug assembly, and more particularly to a plug assembly with a heat dissipation function.

2. The Related Art

As is known to all, a plug assembly which is a quad small form-factor pluggable (QSFP) interface is assembled to a device. The device is a switcher or a router. The quad small form-factor pluggable (QSFP) interface reaches a heat dissipation function by virtue of the device cooperating with the QSFP interface. The plug assembly with the heat dissipation function has a cover, and a circuit board assembled in the cover. An outer surface of the cover has multiple radiating fins. When the plug assembly works, heat energies generated by the plug assembly working are transmitted through a heat conduction way, and then a heat dissipation purpose is reached by use of the multiple radiating fins.

However, in an aforesaid heat dissipation way of the plug assembly, the circuit board hardly contacts with the cover, so a contact area between the circuit board and the cover is decreased and a heat dissipation area of the plug assembly is decreased. As a result, the plug assembly has a worse heat conduction effect and a worse heat dissipation effect to reduce heat dissipation efficiency.

Therefore, it is necessary to provide an innovative plug assembly with a heat dissipation function, so that the innovative plug assembly has a better heat conduction effect and a better heat dissipation effect to improve heat dissipation efficiency.

SUMMARY OF THE INVENTION

An object of the present invention is to provide a plug assembly. The plug assembly includes a lower cover, an upper cover and a circuit board. The upper cover is mounted on the lower cover. The upper cover is equipped with a heat-conducting element. The circuit board is mounted between the upper cover and the lower cover. Two sides of the circuit board have two first contact portions. The two first contact portions contact with the lower cover and the upper cover, and a middle of a top surface of the circuit board has a plurality of second contact portions. The circuit board is equipped with a chip. The chip is mounted on and covers the plurality of the second contact portions. The chip contacts with the heat-conducting element. The circuit board opens at least one perforation. At least one of the lower cover and the upper cover protrudes towards the circuit board to form at least one fastening portion. The at least one fastening portion passes through the at least one perforation and contacts with the at least one of the upper cover and the lower cover.

An object of the present invention is to provide a plug assembly. The plug assembly includes a lower cover, an upper cover and a circuit board. The upper cover is mounted on the lower cover. The upper cover is equipped with a heat-conducting element. The circuit board is mounted between the upper cover and the lower cover. Two sides of the circuit board have two first contact portions. Top surfaces of the two first contact portions are exposed to a top surface of the circuit board, and bottom surfaces of the two first contact portions are exposed to a bottom surface of the circuit board. The top surfaces of the two first contact portions contact with lower surfaces of two sides of the upper cover. The bottom surfaces of the two first contact portions contact with upper surfaces of two sides of the lower cover, and a middle of the top surface of the circuit board has a plurality of second contact portions. The circuit board is equipped with a chip. The chip is mounted on and covers the plurality of the second contact portions. The chip contacts with the heat-conducting element. The circuit board opens at least one perforation. At least one of the lower cover and the upper cover protrudes towards the circuit board to form at least one fastening portion. The at least one fastening portion passes through the at least one perforation and contacts with the at least one of the upper cover and the lower cover.

As described above, the two first contact portions contact with the lower cover and the upper cover, the plurality of the second contact portions contact with the chip and the chip contacts with the heat-conducting element, and the at least one fastening portion passes through the at least one perforation and contacts with the at least one of the lower cover and the upper cover, in this way, contact areas among the circuit board, the lower cover and the upper cover are increased, so that heat energies generated by an operation of the plug assembly may be easily transmitted to lower cover and upper cover. Furthermore, the top surface of the circuit board has the plurality of the second contact portions for increasing a heat dissipation area of the plug assembly. As a result, the plug assembly has a better heat conduction effect and a better heat dissipation effect to improve heat dissipation efficiency.

BRIEF DESCRIPTION OF THE DRAWINGS

The present invention will be apparent to those skilled in the art by reading the following description, with reference to the attached drawings, in which.

DETAILED DESCRIPTION OF THE PREFERRED EMBODIMENT

Figure 1:
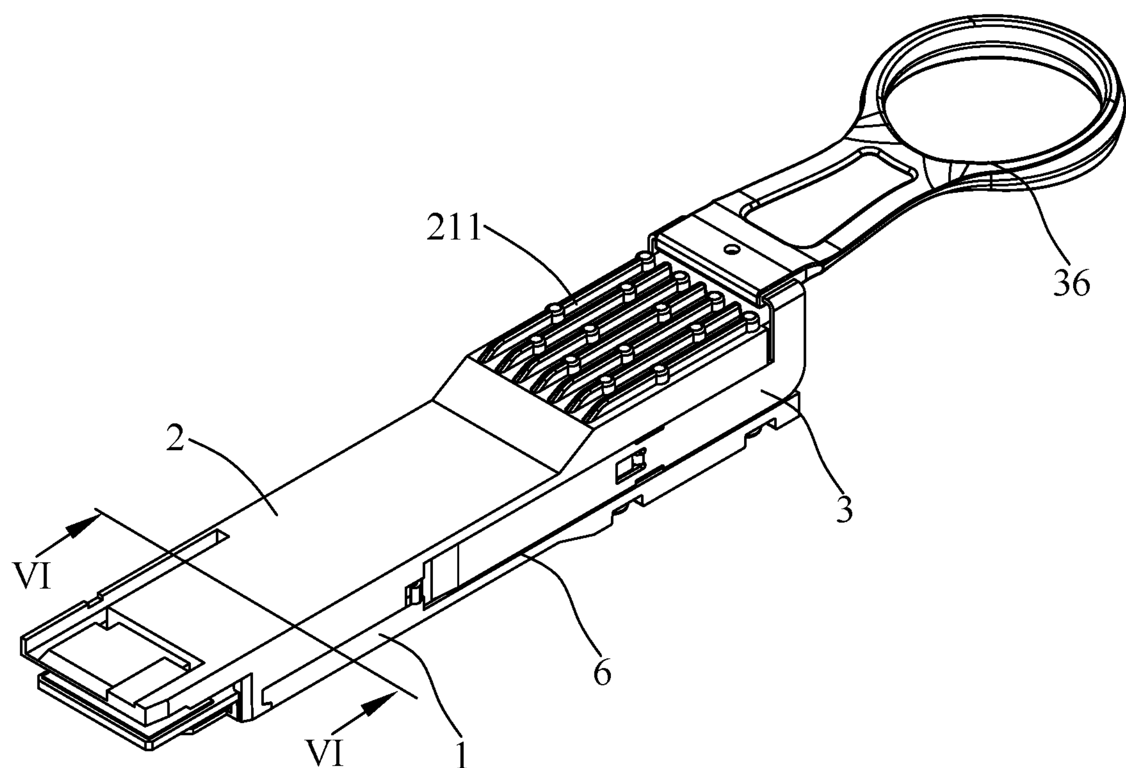
FIG. 1 is a perspective view of a plug assembly in accordance with a preferred embodiment of the present invention.
Figure 2:
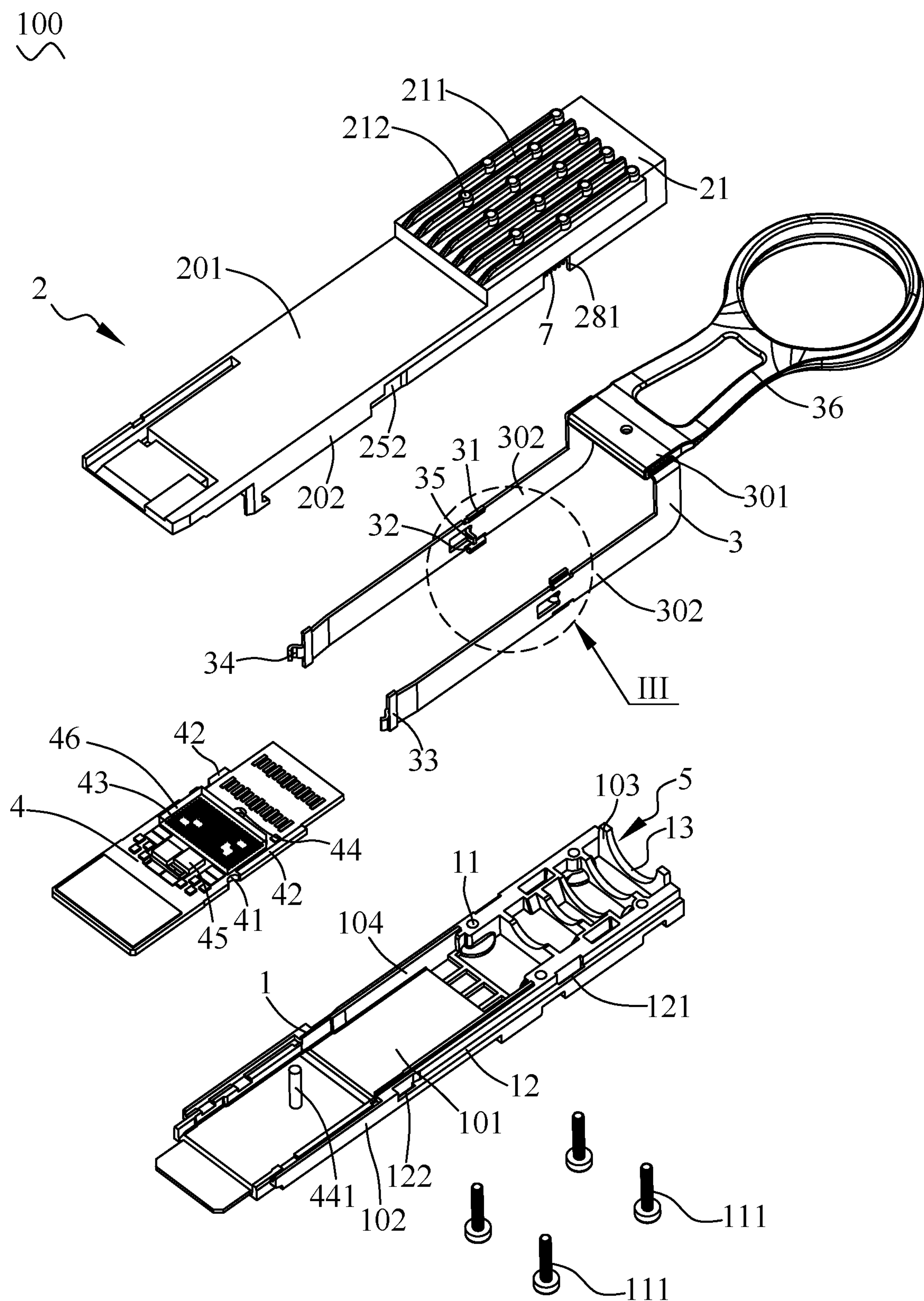
FIG. 2 is an exploded perspective view of the plug assembly of FIG. 1.
Figure 3:
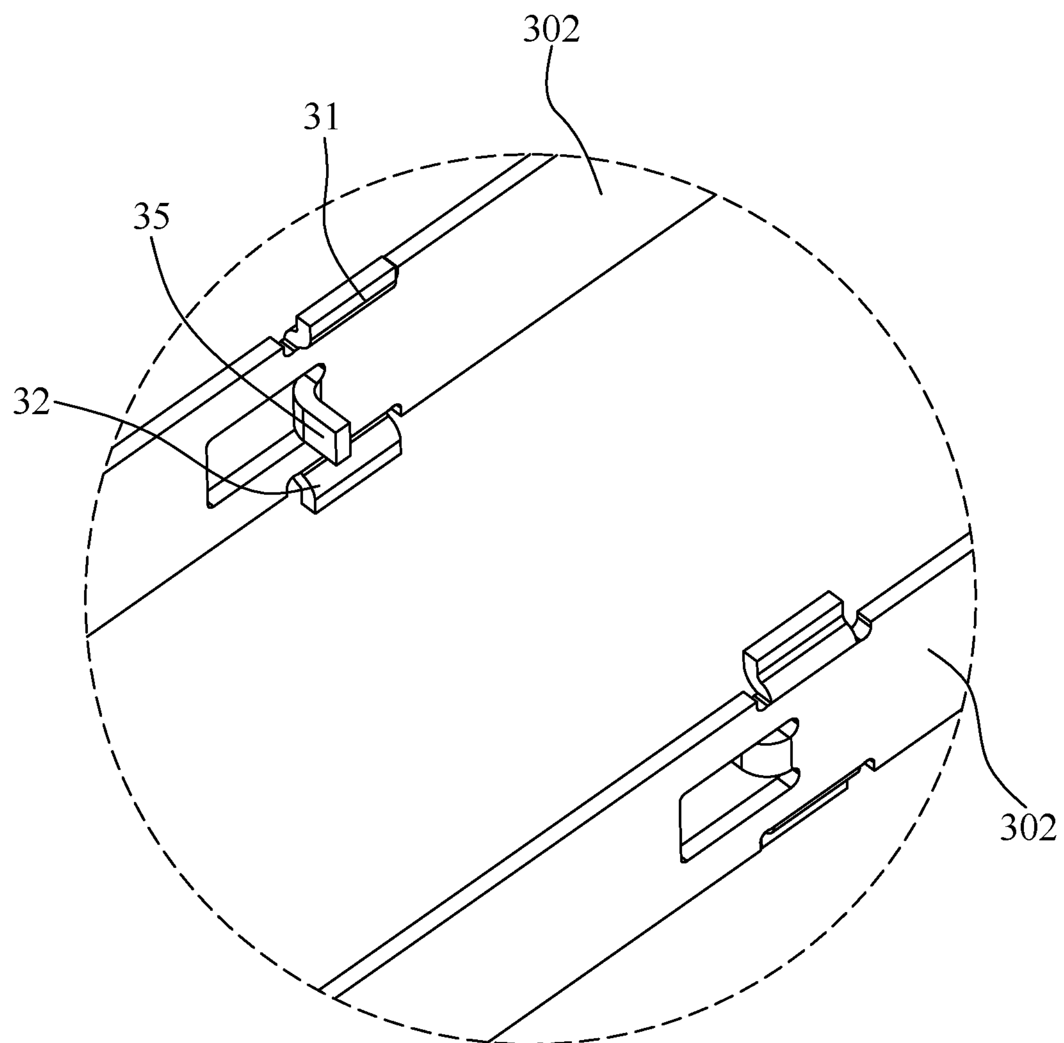
FIG. 3 is an enlarged view of an encircled portion III of the plug assembly of FIG. 2.
Figure 4:
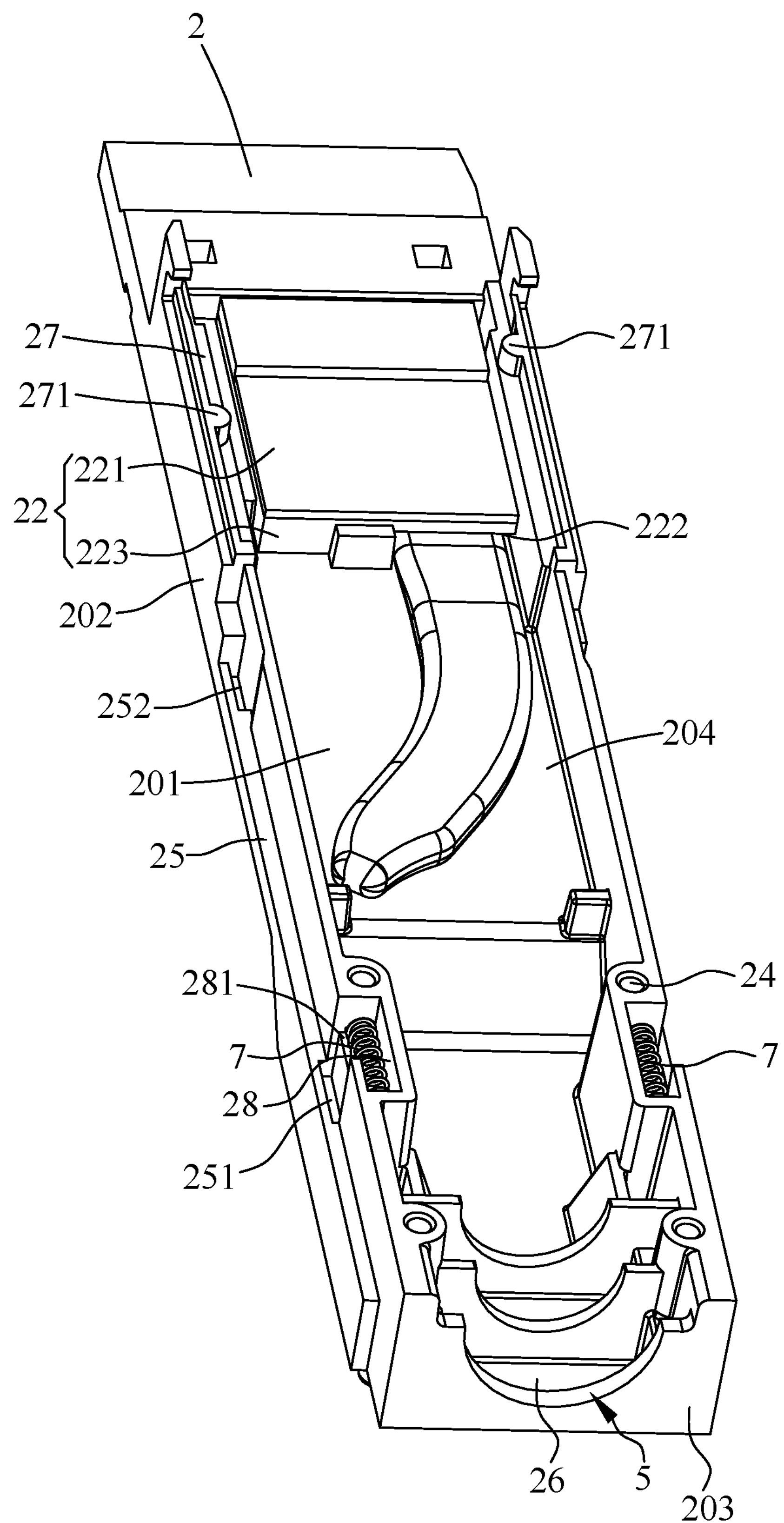
FIG. 4 is a partially perspective view of the plug assembly of FIG. 2.
Figure 5:
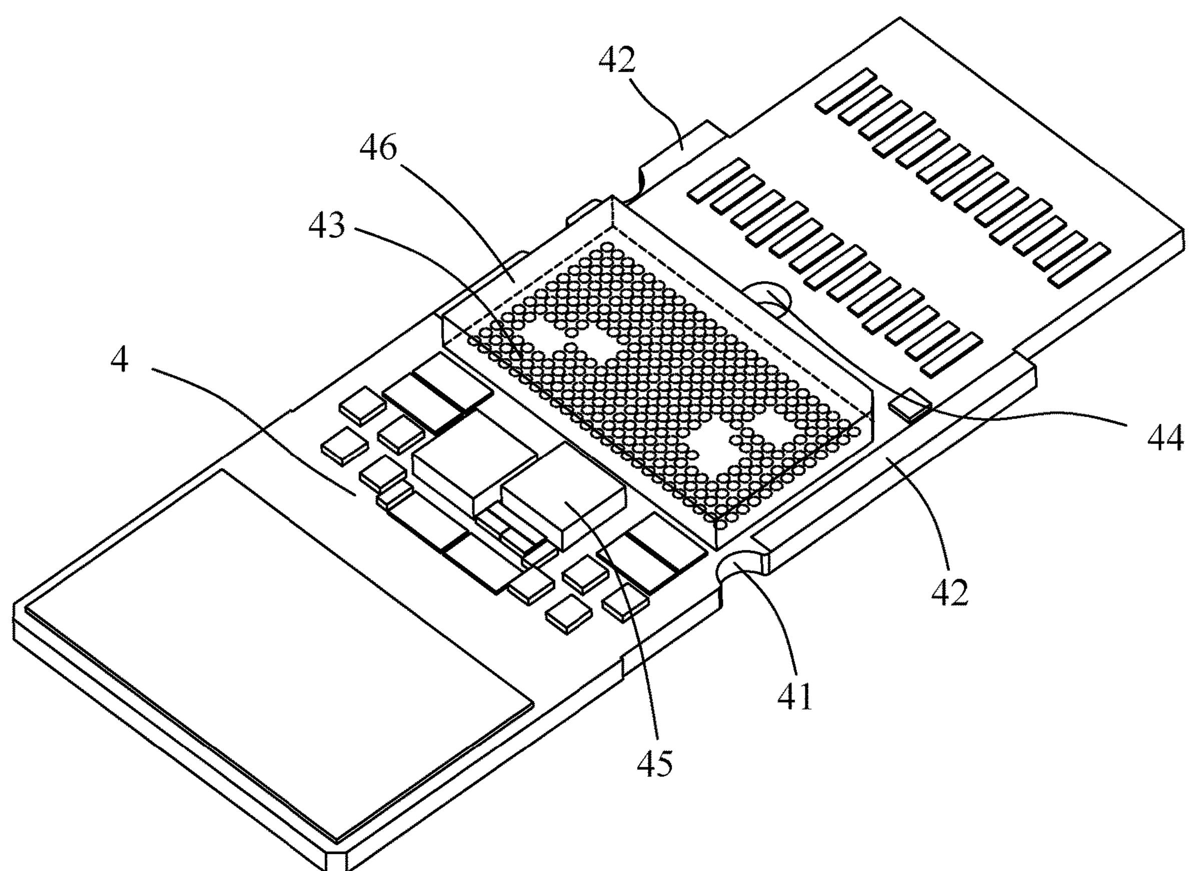
FIG. 5 is a plan view of a circuit board of the plug assembly of FIG. 2.
Figure 6:
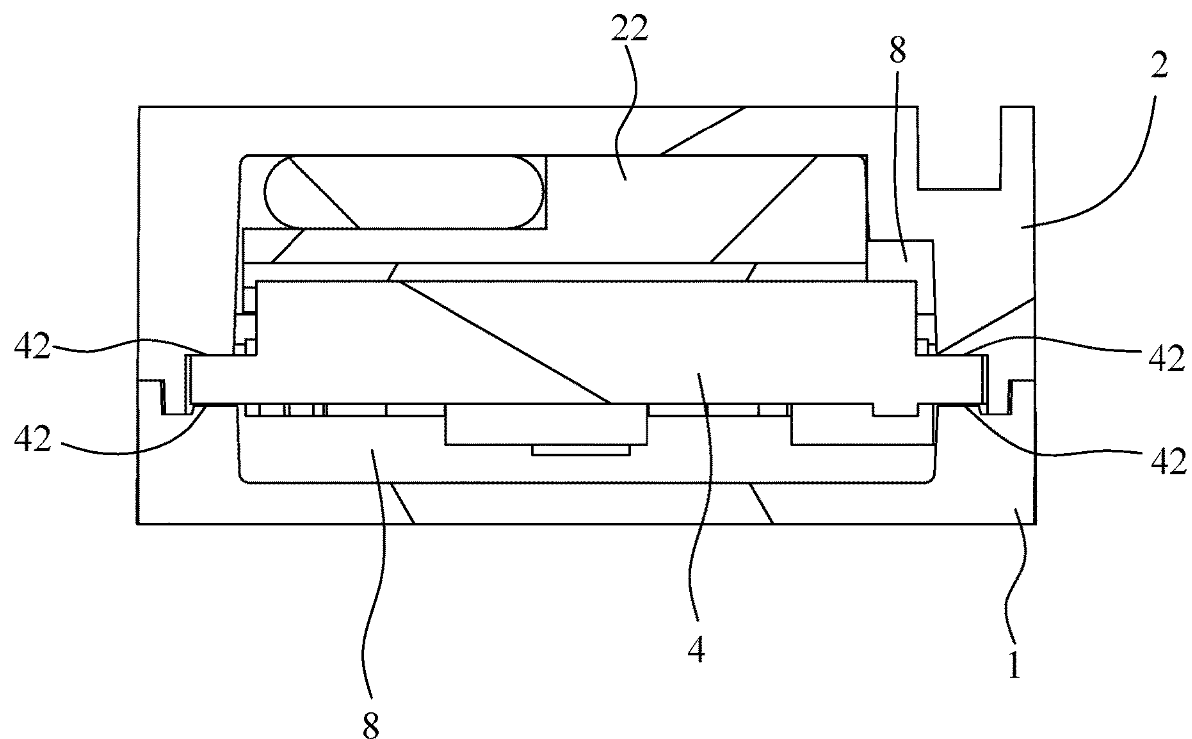
FIG. 6 is a cross-section view of the plug assembly along a line VI-VI of FIG. 1.

With reference to FIG. 1 to FIG. 3, a plug assembly 100 in accordance with a preferred embodiment of the present invention is shown. The plug assembly 100 with a heat dissipation function is a QSFP (Quad Small Form-factor Pluggable) interface. The plug assembly 100 adapted for being assembled in a switcher (not shown) or a router (not shown), includes a lower cover 1, an upper cover 2 and a circuit board 4.

With reference to FIG. 1 to FIG. 6, the lower cover 1 has a rectangular lower base board 101, two lower lateral walls 102 protruded upward from two opposite sides of the lower base board 101, and a lower rear wall 103 protruded upward from a rear end of the lower base board 101 and connected between rear ends of the two lower lateral walls 102. The two lower lateral walls 102 extend longitudinally and show elongated shapes. The lower base board 101, the two lower lateral walls 102 and the lower rear wall 103 surround a lower accommodating space 104 in the lower cover 1. The lower cover 1 opens a plurality of lower fixing holes 11 vertically penetrating through the lower cover 1. The plug assembly 100 further includes a plurality of fixing elements 111.

Two outer side surfaces of the lower cover 1 are recessed inward to form two lower fixing slots 12 opposite to each other. Two outer side surfaces of the two lower lateral walls 102 are recessed inward to form the two lower fixing slots 12 opposite to each other. Rears of two inner side walls of the two lower fixing slots 12 are recessed inward to form two first lower buckling grooves 121 opposite to each other. Fronts of the two inner side walls of the two lower fixing slots 12 are recessed inward to form two second lower buckling grooves 122 opposite to each other. A middle of a top surface of a rear end of the lower cover 1 is recessed downward to form an arc-shaped lower recess 13. A top surface of the lower rear wall 103 of the lower cover 1 is recessed downward to form the arc-shaped lower recess 13.

The upper cover 2 is mounted on the lower cover 1, so the lower cover 1 is mounted to the upper cover 2. The upper cover 2 has a rectangular upper base board 201, two upper lateral walls 202 protruded downward from two opposite sides of the upper base board 201, and an upper rear wall 203 protruded downward from a rear end of the upper base board 201 and connected between rear ends of the two upper lateral walls 202. The two upper lateral walls 202 extend longitudinally and show elongated shapes. The upper base board 201, the two upper lateral walls 202 and the upper rear wall 203 surround an upper accommodating space 204 in the upper cover 2. Two sides of the upper cover 2 are corresponding to two sides of the lower cover 1, respectively. The two upper lateral walls 202 are corresponding to the two lower lateral walls 102, respectively. The upper accommodating space 204 is combined with the lower accommodating space 104 to form an accommodating space 8.

A rear end of a top of the upper cover 2 protrudes upward to form a protruding stage 21. A rear end of a top of the upper base board 201 of the upper cover 2 protrudes upward to form the protruding stage 21. The rear end of the top of the upper cover 2 is equipped with a plurality of heat dissipation fins 211. The plurality of the heat dissipation fins 211 assists for dissipating heat. The plurality of the heat dissipation fins 211 are distributed on the protruding stage 21. The plurality of the heat dissipation fins 211 have a plurality of cylindrical portions 212. The plurality of the cylindrical portions 212 facilitate a material flow of the upper cover 2 in a process of manufacturing the upper cover 2 and also increasing a heat dissipation area of the upper cover 2.

In this preferred embodiment of the present invention, the rear end of the top of the upper cover 2 is equipped with seven heat dissipation fins 211, and each of the seven heat dissipation fins 211 has two cylindrical portions 212. The plurality of the heat dissipation fins 211 are extended along an elongated direction of the plug assembly 100. In this case, each of the plurality of the heat dissipation fins 211 has the two cylindrical portions 212. The two cylindrical portions 212 of one of the heat dissipation fins 211 and the two cylindrical portions 212 of another heat dissipation fin 211 next to the one of the heat dissipation fins 211 are staggered. Front cylindrical portions 212 of odd-numbered heat dissipation fins 211 are in alignment with one another, and rear cylindrical portions 212 of the odd-numbered heat dissipation fins 211 are in alignment with one another. Front cylindrical portions 212 of even-numbered heat dissipation fins 211 are in alignment with one another, and rear cylindrical portions 212 of the even-numbered heat dissipation fins 211 are in alignment with one another.

The plug assembly 100 further includes a heat-conducting element 22. The upper cover 2 is equipped with the heat-conducting element 22. The heat-conducting element 22 includes a first heat-conducting element 223 equipped on a bottom surface of the upper cover 2, and a second heat-conducting element 221 arranged and fastened to a bottom surface of the first heat-conducting element 223. An upper portion of the first heat-conducting element 223 opens a receiving space 222 extending upward to the bottom surface of the upper cover 2 and penetrating rearward through a rear surface of the first heat-conducting element 223. The receiving space 222 extend upward to a bottom surface of the upper base board 201 of the upper cover 2 and penetrate rearward through the rear surface of the first heat-conducting element 223.

With reference to FIG. 1 to FIG. 4 again, the plug assembly 100 further includes a heat-conducting pipe 23 mounted to the bottom surface of the upper cover 2. A front end of the heat-conducting pipe 23 is received in the receiving space 222, and the heat-conducting pipe 23 is located and attached between the bottom surface of the upper cover 2 and the first heat-conducting element 223. The heat-conducting pipe 23 extends rearward through a rear end of the receiving space 222. The front end of the heat-conducting pipe 23 is covered by and soldered to one side of the first heat-conducting element 223, so the front end of the heat-conducting pipe 23 is attached between the bottom surface of the upper cover 2 and the first heat-conducting element 223, and a rear end of the heat-conducting pipe 23 is attached to the bottom surface of the upper cover 2.

In this preferred embodiment of the present invention, the first heat-conducting element 223 is a copper piece, and the heat-conducting pipe 23 is a copper pipe. The second heat-conducting element 221 is one of a thermal grease and a heat dissipation patch. A lower portion of the upper cover 2 opens a plurality of upper fixing holes 24 penetrating through the bottom surface of the upper cover 2. The plurality of the upper fixing holes 24 are corresponding to the plurality of the lower fixing holes 11, respectively. When the upper cover 2 is assembled on the lower cover 1, each of the plurality of the fixing elements 111 passes through one of the plurality of the lower fixing holes 11 and one of the plurality of the upper fixing holes 24 corresponding to the one of the plurality of the lower fixing holes 11 so as to fasten the upper cover 2 to the lower cover 1. The heat-conducting element 22, the heat-conducting pipe 23 and the circuit board 4 are surrounded between the upper cover 2 and the lower cover 1.

Two outer side surfaces of the upper cover 2 are recessed inward to form two upper fixing slots 25 opposite to each other and corresponding to the two lower fixing slots 12, respectively. Two outer side surfaces of the two upper lateral walls 202 are recessed inward to form the two upper fixing slots 25 opposite to each other. The two upper fixing slots 25 are combined with the two lower fixing slots 12 to form two fixing slots 6, respectively. Rears of two inner side walls of the two upper fixing slots 25 are recessed inward to form two first upper buckling grooves 251 opposite to each other and corresponding to the two first lower buckling grooves 121 respectively. Fronts of the two inner side walls of the two upper fixing slots 25 are recessed inward to form two second upper buckling grooves 252 opposite to each other and corresponding to the two second lower buckling grooves 122 respectively. Bottom surfaces of rears of the two sides of the upper cover 2 are concaved upward to form two accommodating grooves 28. Rears of bottom surfaces of the two upper lateral walls 202 are concaved upward to form the two accommodating grooves 28.

The plug assembly 100 further includes two resilient elements 7 accommodated in the two accommodating grooves 28, outer sides of the two accommodating grooves 28 open two notches 281 penetrating through middles of the outer sides of the two accommodating grooves 28. In this preferred embodiment of the present invention, each of the two resilient elements 7 is a spring. Bottom surfaces of fronts of the two sides of the upper cover 2 are concaved upward to form two restricting slots 27, respectively. Fronts of the bottom surfaces of the two upper lateral walls 202 of the upper cover 2 are concaved upward to form the two restricting slots 27 communicated with the upper accommodating space 204, respectively. Two facing inner side walls of the two restricting slots 27 protrude inward into the two restricting slots 27 to form two wedging blocks 271. A middle of a bottom surface of a rear end of the upper cover 2 is recessed upward to form an arc-shaped upper recess 26 corresponding to the lower recess 13. A middle of a bottom surface of the upper rear wall 203 is recessed upward to form the arc-shaped upper recess 26 corresponding to the lower recess 13. When the upper cover 2 is assembled on the lower cover 1, the upper recess 26 and the lower recess 13 are combined into an insertion hole 5. An external cable (not shown) may pass through the insertion hole 5 to be connected with the circuit board 4 of the plug assembly 100.

With reference to FIG. 1 to FIG. 4, the plug assembly 100 further includes a receding element 3, the receding element 3 has an inverted U-shaped base portion 301, and two fixing arms 302 extended frontward from two free ends of the base portion 301, the two fixing arms 302 are fixed in the two fixing slots 6, respectively. The base portion 301 rides on the rear end of the upper cover 2 and is arranged behind the plurality of the heat dissipation fins 211. Tops of the two fixing arms 302 protrude upward to form two upper buckling portions 31. Bottoms of the two fixing arms 302 protrude downward to form two lower buckling portions 32. The two upper buckling portions 31 are corresponding to and buckled in the two first upper buckling grooves 251, respectively. The two lower buckling portions 32 are corresponding to and buckled in the two first lower buckling grooves 121, respectively.

Two free ends of the two fixing arms 302 are connected with two buckling blocks 33 extending vertically, upper portions of the two buckling blocks 33 are buckled in the two second upper buckling grooves 252, respectively, and lower portions of the two buckling blocks 33 are buckled in the two second lower buckling grooves 122, respectively. Middles of fronts of the two buckling blocks 33 are connected with two resisting portions 34 arched oppositely for facilitating withdrawing the plug assembly 100 from the switcher or the router. The two resisting portions 34 are received in the two second upper buckling grooves 252, respectively. The two fixing arms 302 are punched inward towards each other to form two abutting blocks 35. The two abutting blocks 35 pass through the two notches 281 and are assembled in the two accommodating grooves 28, and the two abutting blocks 35 abut against the two resilient elements 7, respectively. The two abutting blocks 35 abut against free ends of the two resilient elements 7, respectively. A rear end of the base portion 301 is connected with a pulling ring 36.

With reference to FIG. 1 to FIG. 6, the circuit board 4 is mounted in the upper cover 2 and is mounted between the upper cover 2 and the lower cover 1. The circuit board 4 is accommodated in the accommodating space 8. The circuit board 4 is matched with and contacts with the second heat-conducting element 221. The circuit board 4 has a heat emitting portion 45 matched with and contacts with the second heat-conducting element 221. Two sides of the circuit board 4 are restricted in the two restricting slots 27, respectively. The circuit board 4 opens two wedging grooves 41 penetrating through two side surfaces of the circuit board 4. The two wedging blocks 271 are wedged in the two wedging grooves 41, respectively, so that the circuit board 4 is assembled in the upper cover 2. The two sides of the circuit board 4 have two first contact portions 42 exposed to an outer surface of the circuit board 4, and a middle of a top surface of the circuit board 4 has a plurality of second contact portions 43. The circuit board 4 is further equipped with a chip 46. The chip 46 is mounted on and covers the plurality of the second contact portions 43.

The two first contact portions 42 contact with the lower cover 1 and the upper cover 2. The chip 46 contacts with the second heat-conducting element 221 of the heat-conducting element 22. The two first contact portions 42 are copper foils of the circuit board 4. Top surfaces of the two first contact portions 42 are exposed to the top surface of the circuit board 4, and bottom surfaces of the two first contact portions 42 are exposed to a bottom surface of the circuit board 4. The top surfaces of the two first contact portions 42 contact with lower surfaces of the two sides of the upper cover 2, and the bottom surfaces of the two first contact portions 42 contact with upper surfaces of the two sides of the lower cover 1. Specifically, the top surfaces of the two first contact portions 42 contact with the bottom surfaces of the two upper lateral walls 202 of the upper cover 2, and the bottom surfaces of the two first contact portions 42 contact with top surfaces of the two lower lateral walls 102 of the lower cover 1. The plurality of the second contact portions 43 are a plurality of circular copper foils formed on the top surface of the circuit board 4. In this preferred embodiment of the present invention, the plurality of the circular copper foils are formed on the heat emitting portion 45 of the circuit board 4.

The circuit board 4 opens at least one perforation 44. The plug assembly 100 further includes at least one fastening portion 441. At least one of the lower cover 1 and the upper cover 2 protrudes towards the circuit board 4 to form the at least one fastening portion 441. The at least one fastening portion 441 passes through the at least one perforation 44 and contacts with the at least one of the lower cover 1 and the upper cover 2. In this preferred embodiment of the present invention, the at least one fastening portion 441 is protruded upward from at least one portion of an upper portion of the lower cover 1, and the at least one fastening portion 441 passes through the at least one perforation 44 of the circuit board 4 and contacts with the upper cover 2. In another preferred embodiment of the present invention, the at least one fastening portion 441 is protruded downward from at least one portion of a lower portion of the upper cover 2, and the at least one fastening portion 441 passes through the at least one perforation 44 and contacts with the lower cover 1.

When the plug assembly 100 is assembled in the switcher or the router, the two sides of the lower cover 1 and the two sides of the upper cover 2 are clamped and fastened by two clamping portions (not shown) of the switcher or the router to make the plug assembly 100 connected with the switcher or the router. When the plug assembly 100 is withdrawn from the switcher or the router, the pulling ring 36 is pulled rearward, because the two sides of the lower cover 1 and the two sides of the upper cover 2 have no way of moving on account of the two sides of the lower cover 1 and the two sides of the upper cover 2 being fastened by the two clamping portions of the switcher or the router, at the moment, the two abutting blocks 35 press rearward the two resilient elements 7, and simultaneously, the two resilient elements 7 generate forward resilient forces to abut against the two abutting blocks 35, respectively. When the pulling ring 36 is kept being pulled rearward, because the two abutting blocks 35 are affected by the resilient forces of the two resilient elements 7 to have no way of being kept moving rearward, two sides of the receding element 3 are made to expand, so that the two resisting portions 34 prop the two clamping portions to make the two clamping portions opened, the plug assembly 100 is able to be withdrawn from the switcher or the router.

When the plug assembly 100 is assembled and works in the switcher or the router, the circuit board 4 emits the heat due to a flow of electric currents, at the moment, the two first contact portions 42 are in contact with the lower cover 1 and the upper cover 2, the plurality of the second contact portions 43 are in contact with the chip 46 and the chip 46 is in contact with the second heat-conducting element 221. Thus, heat energies of the circuit board 4 are conducted to the heat-conducting element 22 and the heat-conducting pipe 23 by virtue of the heat energies of the circuit board 4 being conducted through the chip 46 to the second heat-conducting element 221, so that the heat energies of the circuit board 4 are conducted through the upper cover 2 to a surface of the lower cover 1 and the upper cover 2 of the plug assembly 100 and the plurality of the heat dissipation fins 211. The heat energies of the circuit board 4 may be transmitted to the lower cover 1 and the upper cover 2 to reach an average temperature by virtue of the at least one fastening portion 441 passing through the at least one perforation 44. The at least one perforation 44, and the increased two first contact portions 42 and the plurality of the second contact portions 43 of the circuit board 4 make the plug assembly 100 have a better heat conduction effect. The surface of the lower cover 1 and the upper cover 2 of the plug assembly 100 is in contact with an inner wall of the switcher or the router to transmit the heat energies of the circuit board 4 to the switcher or the router, and a fan (not shown) of the switcher or the router extracts external air into the switcher or the router, and a forced convection between the plurality of the heat dissipation fins 211 of the switcher or the router and the external air to achieve a better heat dissipation effect.

As described above, the two first contact portions 42 contact with the lower cover 1 and the upper cover 2, the plurality of the second contact portions 43 contact with the chip 46 and the chip 46 contacts with the second heat-conducting element 221 of the heat-conducting element 22, and the at least one fastening portion 441 passes through the at least one perforation 44 and contacts with the at least one of the lower cover 1 and the upper cover 2, in this way, contact areas among the circuit board 4, the lower cover 1 and the upper cover 2 are increased, so that heat energies generated by an operation of the plug assembly 100 may be easily transmitted to lower cover 1 and upper cover 2. Furthermore, the top surface of the circuit board 4 has the plurality of the second contact portions 43 for increasing a heat dissipation area of the plug assembly 100. As a result, the plug assembly 100 has a better heat conduction effect and the better heat dissipation effect to improve heat dissipation efficiency.

What is claimed is:

1. A plug assembly, comprising:

a lower cover;

an upper cover mounted on the lower cover, the upper cover being equipped with a heat-conducting element; and a circuit board mounted between the upper cover and the lower cover, two sides of the circuit board having two first contact portions, the two first contact portions contacting with the lower cover and the upper cover, and a middle of a top surface of the circuit board having a plurality of second contact portions, the circuit board being equipped with a chip, the chip being mounted on and covering the plurality of the second contact portions, the chip contacting with the heat-conducting element, the circuit board opening at least one perforation, at least one of the lower cover and the upper cover protruding towards the circuit board to form at least one fastening portion, the at least one fastening portion passing through the at least one perforation and contacting with the other of the at least one of the upper cover and the lower cover.

2. The plug assembly as claimed in claim 1, wherein top surfaces of the two first contact portions are exposed to the top surface of the circuit board, and bottom surfaces of the two first contact portions are exposed to a bottom surface of the circuit board, the top surfaces of the two first contact portions contact with lower surfaces of two sides of the upper cover, the bottom surfaces of the two first contact portions contact with upper surfaces of two sides of the lower cover.

3. The plug assembly as claimed in claim 1, wherein the two first contact portions are copper foils of the circuit board, the plurality of the second contact portions are a plurality of circular copper foils formed on the top surface of the circuit board, the plurality of the second contact portions are formed on a bottom surface of the circuit board.

4. The plug assembly as claimed in claim 1, wherein the at least one fastening portion is protruded upward from at least one portion of an upper portion of the lower cover, and the at least one fastening portion passes through the at least one perforation and contacts with the upper cover.

5. The plug assembly as claimed in claim 1, wherein the at least one fastening portion is protruded downward from at least one portion of a lower portion of the upper cover, and the at least one fastening portion passes through the at least one perforation and contacts with the lower cover.

6. The plug assembly as claimed in claim 1, wherein the lower cover has a lower base board, two lower lateral walls protruded upward from two opposite sides of the lower base board, and a lower rear wall protruded upward from a rear end of the lower base board, the lower base board, the two lower lateral walls and the lower rear wall surround a lower accommodating space in the lower cover, the upper cover has an upper base board, two upper lateral walls protruded downward from two opposite sides of the upper base board, and an upper rear wall protruded downward from a rear end of the upper base board, the upper base board, the two upper lateral walls and the upper rear wall surround an upper accommodating space in the upper cover, the lower cover is mounted to the upper cover, the upper accommodating space is combined with the lower accommodating space to form an accommodating space, the circuit board is accommodated in the accommodating space, top surfaces of the two first contact portions contact with bottom surfaces of the two upper lateral walls, and bottom surfaces of the two first contact portions contact with top surfaces of the two lower lateral walls.

7. The plug assembly as claimed in claim 6, wherein fronts of the bottom surfaces of the two upper lateral walls of the upper cover are concaved upward to form two restricting slots communicated with the upper accommodating space, respectively, two facing inner side walls of the two restricting slots protrude inward into the two restricting slots to form two wedging blocks, the two sides of the circuit board are restricted in the two restricting slots, respectively, the circuit board opens two wedging grooves penetrating through two side surfaces of the circuit board, the two wedging blocks are wedged in the two wedging grooves, respectively, so that the circuit board is assembled in the upper cover.

8. The plug assembly as claimed in claim 1, wherein a rear end of a top of the upper cover is equipped with a plurality of heat dissipation fins, the plug assembly further includes a heat-conducting pipe, the heat-conducting element includes a first heat-conducting element equipped on a bottom surface of the upper cover, and a second heat-conducting element fastened to a bottom surface of the first heat-conducting element, an upper portion of the first heat-conducting element opens a receiving space penetrating through a rear surface of the first heat-conducting element, a front end of the heat-conducting pipe is received in the receiving space, and the front end of the heat-conducting pipe is attached between the bottom surface of the upper cover and the first heat-conducting element, the heat-conducting pipe extends rearward through a rear end of the receiving space, a rear end of the heat-conducting pipe is attached to the bottom surface of the upper cover, the chip contacts with the second heat-conducting element.

9. The plug assembly as claimed in claim 8, wherein the front end of the heat-conducting pipe is soldered to one side of the first heat-conducting element.

10. The plug assembly as claimed in claim 8, wherein the first heat-conducting element is a copper piece, and the heat-conducting pipe is a copper pipe.

11. The plug assembly as claimed in claim 8, wherein the second heat-conducting element is one of a thermal grease and a heat dissipation patch.

12. The plug assembly as claimed in claim 8, wherein the plurality of the heat dissipation fins have a plurality of cylindrical portions.

13. The plug assembly as claimed in claim 12, wherein the rear end of the top of the upper cover is equipped with seven heat dissipation fins, and each of the heat dissipation fins has two cylindrical portions, the two cylindrical portions of one of the heat dissipation fins and the two cylindrical portions of another heat dissipation fin next to the one of the heat dissipation fins are staggered.

14. The plug assembly as claimed in claim 12, wherein front cylindrical portions of odd-numbered heat dissipation fins are in alignment with one another, and rear cylindrical portions of the odd-numbered heat dissipation fins are in alignment with one another, front cylindrical portions of even-numbered heat dissipation fins are in alignment with one another, and rear cylindrical portions of the even-numbered heat dissipation fins are in alignment with one another.

15. The plug assembly as claimed in claim 1, further comprising a plurality of fixing elements, the lower cover opening a plurality of lower fixing holes vertically penetrating through the lower cover, a lower portion of the upper cover opening a plurality of upper fixing holes penetrating through a bottom surface of the upper cover, the plurality of the upper fixing holes being corresponding to the plurality of the lower fixing holes, respectively, when the upper cover is assembled on the lower cover, each of the plurality of the fixing elements passing through one of the plurality of the lower fixing holes and one of the plurality of the upper fixing holes corresponding to the one of the plurality of the lower fixing holes so as to fasten the upper cover to the lower cover.

16. The plug assembly as claimed in claim 1, wherein a top surface of a rear end of the lower cover is recessed downward to form a lower recess, a bottom surface of a rear end of the upper cover is recessed upward to form an upper recess corresponding to the lower recess, when the upper cover is assembled on the lower cover, the upper recess and the lower recess are combined into an insertion hole.

17. The plug assembly as claimed in claim 1, wherein two outer side surfaces of the lower cover are recessed inward to form two lower fixing slots opposite to each other, two outer side surfaces of the upper cover are recessed inward to form two upper fixing slots opposite to each other and corresponding to the two lower fixing slots respectively, the two upper fixing slots are combined with the two lower fixing slots to form two fixing slots, respectively, the plug assembly further includes a receding element, the receding element has an inverted U-shaped base portion riding on a rear end of the upper cover, and two fixing arms extended frontward from two free ends of the base portion, the two fixing arms are fixed in the two fixing slots, respectively, a rear end of the base portion is connected with a pulling ring.

18. The plug assembly as claimed in claim 17, wherein rears of two inner side walls of the two lower fixing slots are recessed inward to form two first lower buckling grooves opposite to each other, rears of two inner side walls of the two upper fixing slots are recessed inward to form two first upper buckling grooves opposite to each other and corresponding to the two first lower buckling grooves respectively, tops of the two fixing arms protrude upward to form two upper buckling portions, bottoms of the two fixing arms protrude downward to form two lower buckling portions, the two upper buckling portions are corresponding to and buckled in the two first upper buckling grooves, respectively, the two lower buckling portions are corresponding to and buckled in the two first lower buckling grooves, respectively.

19. The plug assembly as claimed in claim 17, wherein the two fixing arms are punched inward towards each other to form two abutting blocks, bottom surfaces of rears of two sides of the upper cover are concaved upward to form two accommodating grooves, the plug assembly further includes two resilient elements accommodated in the two accommodating grooves, outer sides of the two accommodating grooves open two notches penetrating through middles of the outer sides of the two accommodating grooves, the two abutting blocks pass through the two notches and are assembled in the two accommodating grooves, and the two abutting blocks abut against the two resilient elements, respectively, each of the two resilient elements is a spring.

20. A plug assembly, comprising:

a lower cover;

an upper cover mounted on the lower cover, the upper cover being equipped with a heat-conducting element; and a circuit board mounted between the upper cover and the lower cover, two sides of the circuit board having two first contact portions, top surfaces of the two first contact portions being exposed to a top surface of the circuit board, and bottom surfaces of the two first contact portions being exposed to a bottom surface of the circuit board, the top surfaces of the two first contact portions contacting with lower surfaces of two sides of the upper cover, the bottom surfaces of the two first contact portions contacting with upper surfaces of two sides of the lower cover, and a middle of the top surface of the circuit board having a plurality of second contact portions, the circuit board being equipped with a chip, the chip being mounted on and covering the plurality of the second contact portions, the chip contacting with the heat-conducting element, the circuit board opening at least one perforation, at least one of the lower cover and the upper cover protruding towards the circuit board to form at least one fastening portion, the at least one fastening portion passing through the at least one perforation and contacting with the other of the at least one of the upper cover and the lower cover.

* * * * *